(12) United States Patent
Nakai et al.

(10) Patent No.: US 10,910,222 B2
(45) Date of Patent: Feb. 2, 2021

(54) METHOD FOR MANUFACTURING SEMICONDUCTOR DEVICE

(71) Applicant: Mitsubishi Electric Corporation, Tokyo (JP)

(72) Inventors: Eiji Nakai, Tokyo (JP); Harunaka Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/475,252

(22) PCT Filed: May 12, 2017

(86) PCT No.: PCT/JP2017/018051
§ 371 (c)(1),
(2) Date: Jul. 1, 2019

(87) PCT Pub. No.: WO2018/207355
PCT Pub. Date: Nov. 15, 2018

(65) Prior Publication Data
US 2020/0357642 A1     Nov. 12, 2020

(51) Int. Cl.
*H01L 21/223*  (2006.01)
*H01L 21/02*  (2006.01)
*H01S 5/30*  (2006.01)

(52) U.S. Cl.
CPC .... *H01L 21/2233* (2013.01); *H01L 21/02387* (2013.01); *H01L 21/02538* (2013.01); *H01S 5/3013* (2013.01); *H01S 2304/04* (2013.01)

(58) Field of Classification Search
CPC ......... H01L 21/2233; H01L 21/02387; H01L 21/02538; H01L 21/02532; H01L 21/0262;
(Continued)

(56) References Cited

U.S. PATENT DOCUMENTS 4,342,944 A * 8/1982 SpringThorpe ..... H01L 33/0025
313/499
5,821,569 A * 10/1998 Dutta ...................... H01L 33/10
257/96
(Continued)

FOREIGN PATENT DOCUMENTS

JP    H01-081219 A    3/1989
JP    H02-241030 A    9/1990
(Continued)

OTHER PUBLICATIONS

International Search Report; Written Opinion; and Notification of Transmittal of the International Search Report and the Written Opinion of the International Searching Authority, or the Declaration issued in PCT/JP2017/018051; dated Aug. 8, 2017.

*Primary Examiner* — Bo B Jang
(74) *Attorney, Agent, or Firm* — Studebaker & Brackett PC

(57) ABSTRACT

An upper layer (4,5) made of non-doped III-V compound semiconductor is formed on a lower layer (3) made of non-doped III-V compound semiconductor. Impurity source gas is fed through vapor phase diffusion using an organometallic vapor-phase epitaxy device to add an impurity to the upper layer (4,5). The vapor phase diffusion is continued with the feed of the impurity source gas stopped or with a feed amount of the impurity source gas lowered.

7 Claims, 4 Drawing Sheets

(58) Field of Classification Search
CPC ............. H01L 21/02381; H01S 5/3013; H01S 2304/04; C30B 25/02; C30B 29/06
USPC ........ 438/495, 499, 501, 505, 506, 508, 509
See application file for complete search history.

(56) References Cited

U.S. PATENT DOCUMENTS

| | | | | |
|---|---|---|---|---|
| 2004/0099859 | A1* | 5/2004 | Nakahara | H01S 5/12 257/14 |
| 2004/0165632 | A1* | 8/2004 | Ohkubo | H01S 5/162 372/45.01 |
| 2006/0001042 | A1* | 1/2006 | Suzuki | H01L 33/14 257/103 |
| 2006/0220032 | A1* | 10/2006 | Arai | H01L 33/02 257/79 |
| 2007/0045651 | A1* | 3/2007 | Suzuki | H01L 33/02 257/102 |
| 2009/0010291 | A1* | 1/2009 | Takahashi | B82Y 20/00 372/45.011 |
| 2009/0086781 | A1* | 4/2009 | Tanabe | H01S 5/22 372/46.01 |

FOREIGN PATENT DOCUMENTS

| | | |
|---|---|---|
| JP | H06-310449 A | 11/1994 |
| JP | 2004-047962 A | 2/2004 |
| JP | 2009-032738 A | 2/2009 |

\* cited by examiner

METHOD FOR MANUFACTURING SEMICONDUCTOR DEVICE

FIELD

The present invention relates to a method for manufacturing a semiconductor device in which an impurity is added to compound semiconductor by a vapor phase diffusion method.

BACKGROUND

An optical semiconductor laser using compound semiconductor has an epitaxial structure of stacked layers: a contact layer which is a layer to be brought into contact with an electrode, an active layer constituting a light-emitting part, and cladding layers which sandwich the active layer to confine carriers and light. With increasing capacity of an optical communication network, there is a demand for further higher speed and temperature operation and lower power consumption. Therefore, higher crystal quality of the active layer and lower resistance of the device are necessary. Impurity addition by conventional crystal growth technologies has resulted in lowering the crystal quality due to diffusion of the impurity into the active layer, which has caused decreases in light emission efficiency and optical output. Moreover, the impurity tends to easily diffuse into the active layer also due to raising an impurity concentration in the cladding layer in order to lower the series resistance of the device.

Meanwhile, a vapor phase diffusion method has been used as a technique for high-concentration doping without causing an impurity to diffuse into the active layer. For example, there is proposed addition of Zn by allowing DMZn or the like as a raw material for diffusion to flow in a vapor phase epitaxy device using an open tube method with the same, to dope 1E19 cm' of Zn to an InGaAsP contact layer and dope 1E18 $cm^{-3}$ to an InP cladding layer (for example, see Patent Literature 1). Moreover, in order to achieve a low resistance of the p-InP cladding layer, there is proposed further higher-concentration doping by the vapor phase diffusion method after crystal growth of the cladding layer under addition of Zn (for example, see Patent Literature 2).

CITATION LIST

Patent Literature

[PTL 1] JP H6-310449 A
[PTL 2] JP 2009-032738 A
[PTL 3] JP 2004-047962 A

SUMMARY

Technical Problem

However, a vapor phase diffusion technology in which an impurity is diffused in a non-doped layer results in a concentration gradient in the cladding layer, which causes a decrease in carrier concentration between the cladding layer and an active layer. A decrease in the carrier concentration in the cladding layer near the active layer leads to diffusion of carriers confined in the active layer into the cladding layer, which problematically increases an operation current of laser. Moreover, diffusion for a long time for the purpose of raising the carrier concentration in the cladding layer near the active layer causes the impurity to be diffused in the active layer and the crystal quality of the active layer to be lowered.

Moreover, addition of the impurity to the cladding layer during the crystal growth thereof also results in diffusion of the impurity into the active layer due to a thermal history of regrowth afterward or a thermal history in the vapor phase diffusion, which problematically lowers the crystal quality of the active layer.

An object of the present invention, which has been made to solve the aforementioned problems, is to obtain a method for manufacturing a semiconductor device capable of raising an impurity concentration in an upper layer near a lower layer while preventing the impurity from diffusing into the lower layer.

Solution to Problem

A method for manufacturing a semiconductor device according to the present invention includes: forming an upper layer made of non-doped III-V compound semiconductor on a lower layer made of non-doped III-V compound semiconductor; feeding impurity source gas through vapor phase diffusion using an organometallic vapor-phase epitaxy device to add an impurity to the upper layer; and continuing the vapor phase diffusion with the feed of the impurity source gas stopped or with a feed amount of the impurity source gas lowered.

Advantageous Effects of Invention

The present invention makes it possible to raise an impurity concentration in the upper layer near the lower layer while preventing the impurity from diffusing into the lower layer.

DESCRIPTION OF EMBODIMENTS

A method for manufacturing a semiconductor device according to the embodiments of the present invention will be described with reference to the drawings. The same components will be denoted by the same symbols, and the repeated description thereof may be omitted.

Embodiment 1

Figure 1:
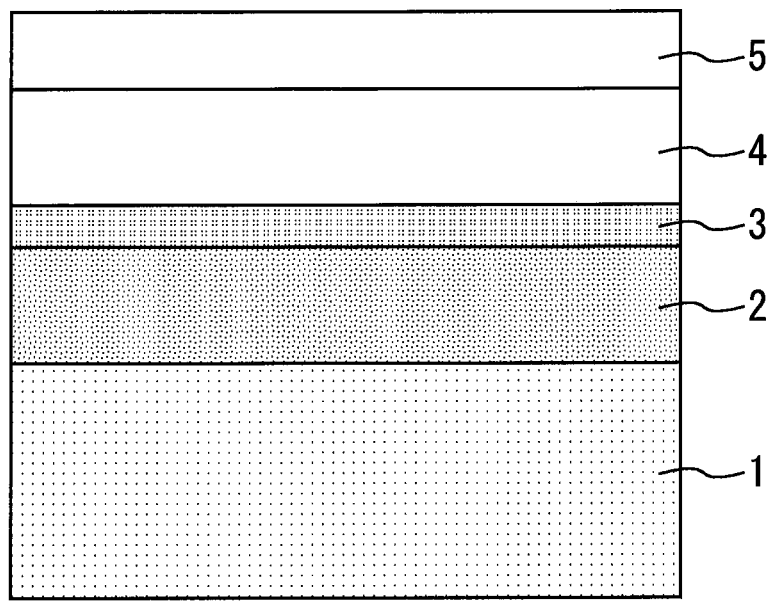
FIG. 1 is a cross-sectional view for illustrating a method for manufacturing a semiconductor device according to Embodiment 1 of the present invention.
Figure 2:
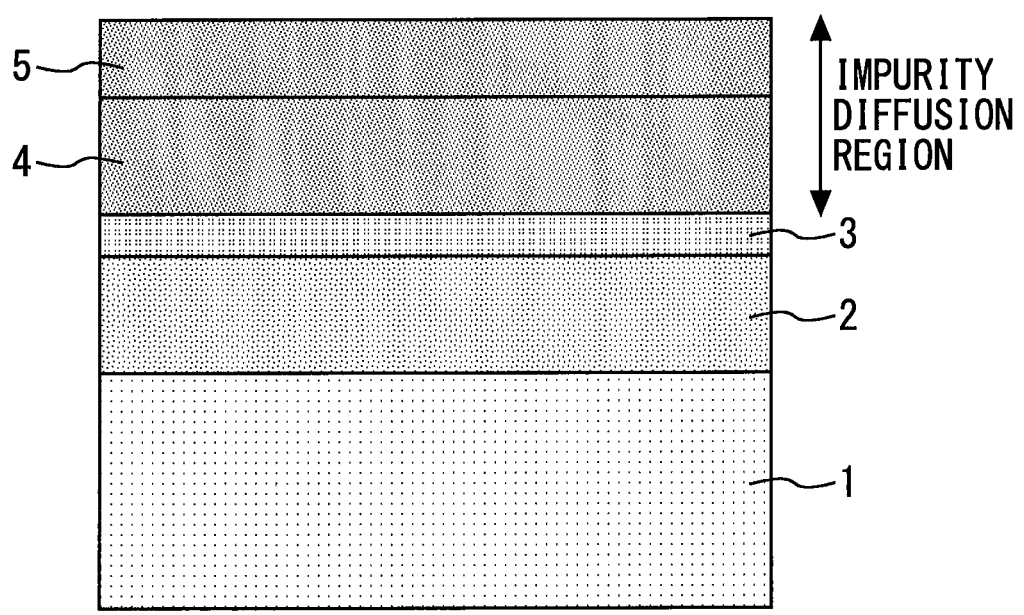
FIG. 2 is a cross-sectional view for illustrating a method for manufacturing a semiconductor device according to Embodiment 1 of the present invention.

FIG. 1 and FIG. 2 are cross-sectional views for illustrating a method for manufacturing a semiconductor device according to Embodiment 1 of the present invention. As illustrated in FIG. 1, first an n-type InP cladding layer 2 and an active layer 3 are sequentially formed on an n-type InP substrate 1 using an organometallic vapor-phase epitaxy device through production steps similar to conventional ones. Although in a conventional method, a p-type cladding layer and a p-type contact layer are next formed by a crystal growth technology, the present embodiment sequentially forms a cladding layer 4 of non-doped InP and a contact layer 5 of non-doped InGaAs or of non-doped InGaAsP, to which impurities are not added deliberately.

Through vapor phase diffusion still using the organometallic vapor-phase epitaxy device used for the crystal growth, as illustrated in FIG. 2, an impurity is added to the cladding layer 4 and the contact layer 5 above the active layer 3 to make them p-type ones. To make them p-type ones, impurity source gas such as DEZn or DMZn, and group V source gas such as $AsH_3$ or $PH_3$ are fed into a furnace. In this way, the impurity can be diffused while a group V raw material is suppressed from escaping in order to secure semiconductor crystallinity. For example, a diffusion operation temperature is 400 to 450° C. and a pressure in the reactor is 100 to 700 mbar. By using vapor phase diffusion, the impurity can be added to the cladding layer 4 and the contact layer 5 in high concentration.

Next, the vapor phase diffusion is continued with the feed of the impurity source gas stopped or with the feed amount thereof lowered. During the vapor phase diffusion, the diffusion operation temperature and the pressure in the reactor are maintained, and the group V source gas is continued to be fed. If further needed, the vapor phase diffusion is continued with the feed of the impurity source gas resumed or with the feed amount thereof raised. Only a semiconductor crystal growth device using an MFC (mass flow controller) can attain such a method of controlling the feed amount of impurity source gas with high accuracy, and it is difficult for conventional closed tube schemes to attain the same. Use of an MFC enables fine control of an impurity concentration profile in one diffusion step.

Figure 3:
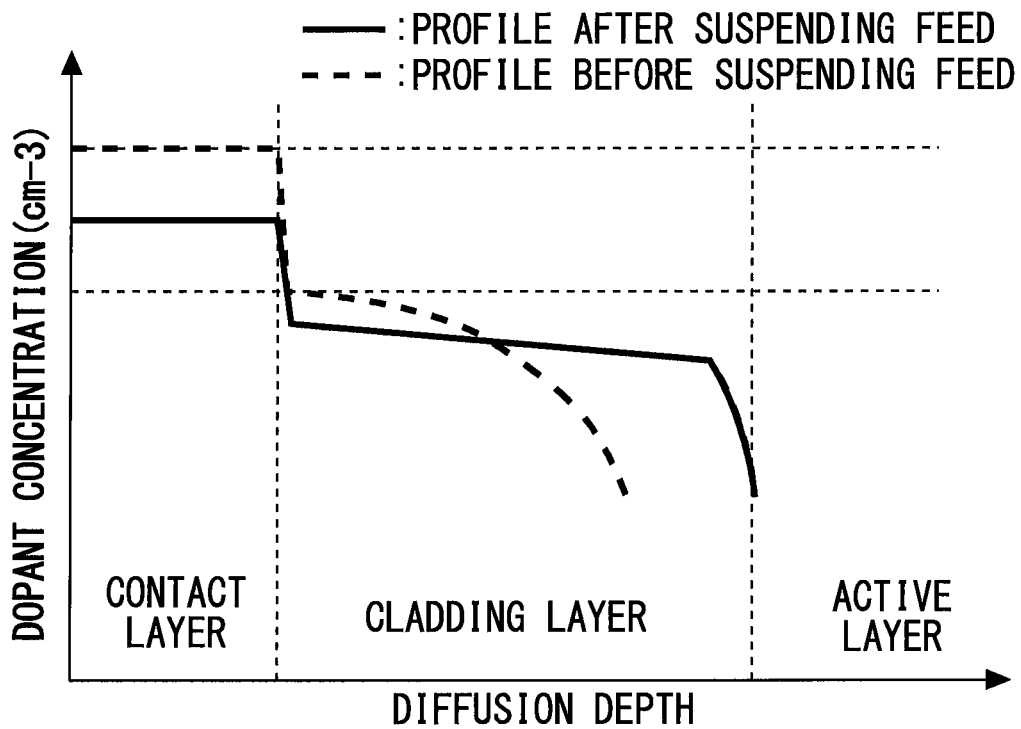
FIG. 3 is a diagram illustrating impurity profiles of a semiconductor device according to Embodiment 1 of the present invention.
Figure 4:
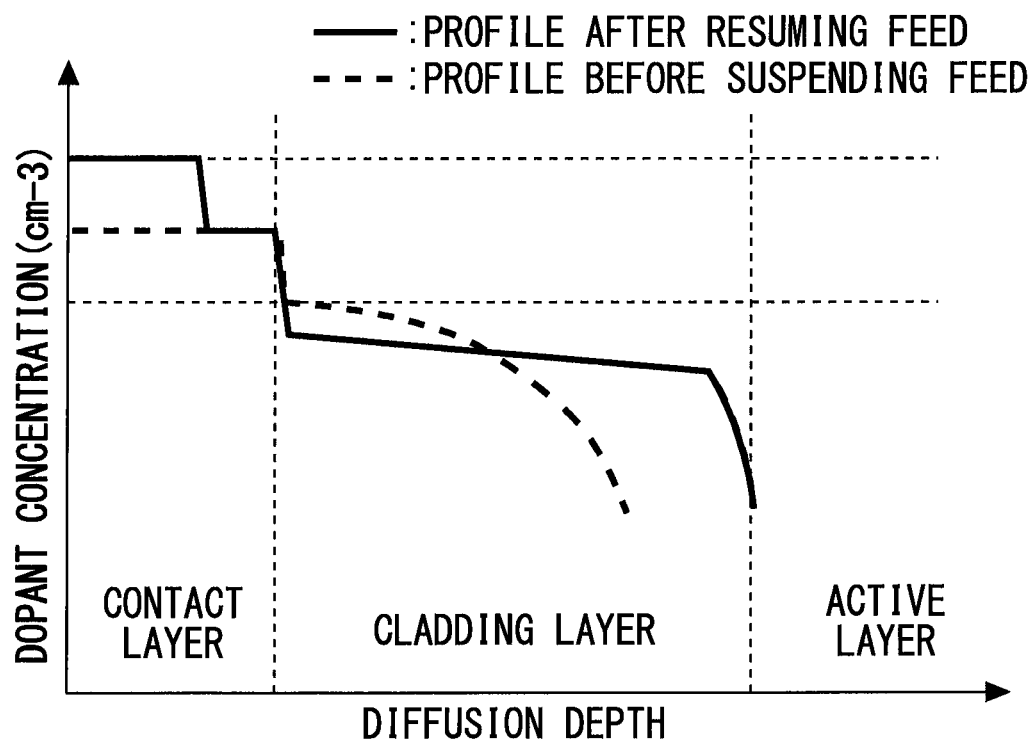
FIG. 4 is a diagram illustrating impurity profiles of a semiconductor device according to Embodiment 1 of the present invention.

FIG. 3 and FIG. 4 are diagrams illustrating impurity profiles of a semiconductor device according to Embodiment 1 of the present invention. As apparent from a profile before suspending the feed in FIG. 3, a diffusion method in which an impurity is diffused from the layer surface shows a tendency for the concentration to be higher as closer to the layer surface and to be lower as closer to the front of the diffusion. Therefore, in the present embodiment, vapor phase diffusion is continued with the feed of the impurity source gas stopped or with the feed amount thereof lowered. As apparent from a profile after suspending the feed in FIG. 3, this reduces the impurity concentration on the layer surface, and the impurity diffuses such that the concentration distribution is to be uniform. Thus, a sufficient carrier concentration can be secured while the impurity profile quickly drops at the interface between the cladding layer 4 high in diffusion speed and the active layer 3 low in diffusion speed. Therefore, while the impurity can be prevented from diffusing in the active layer 3, the impurity concentration can be raised in the cladding layer 4 near the active layer 3 with the impurity concentration in the cladding layer 4 made flat. In this way, an overflow of carriers can be suppressed while reducing the series resistance of the device and securing crystal quality of the active layer 3.

It should be noted that making the impurity concentration flat causes reduction of the impurity concentration at the surface of the contact layer 5. Therefore, the vapor phase diffusion is continued with the feed of the impurity source gas resumed or with the feed amount thereof raised. As apparent from a profile after resuming the feed in FIG. 4, this additionally enables addition of the impurity to the surface of the contact layer 5, which can reduce a contact resistance.

Embodiment 2

Figure 5:
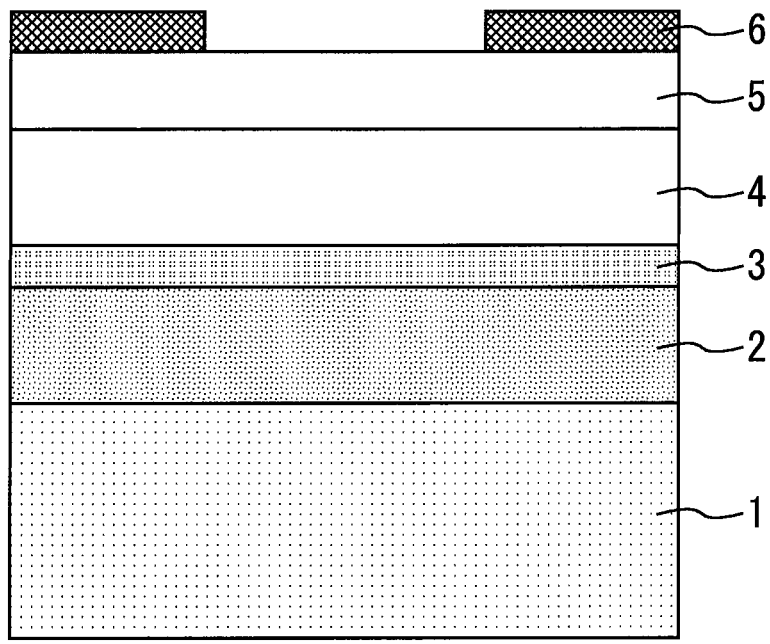
FIG. 5 is a cross-sectional view for illustrating a method for manufacturing a semiconductor device according to Embodiment 2 of the present invention.
Figure 6:
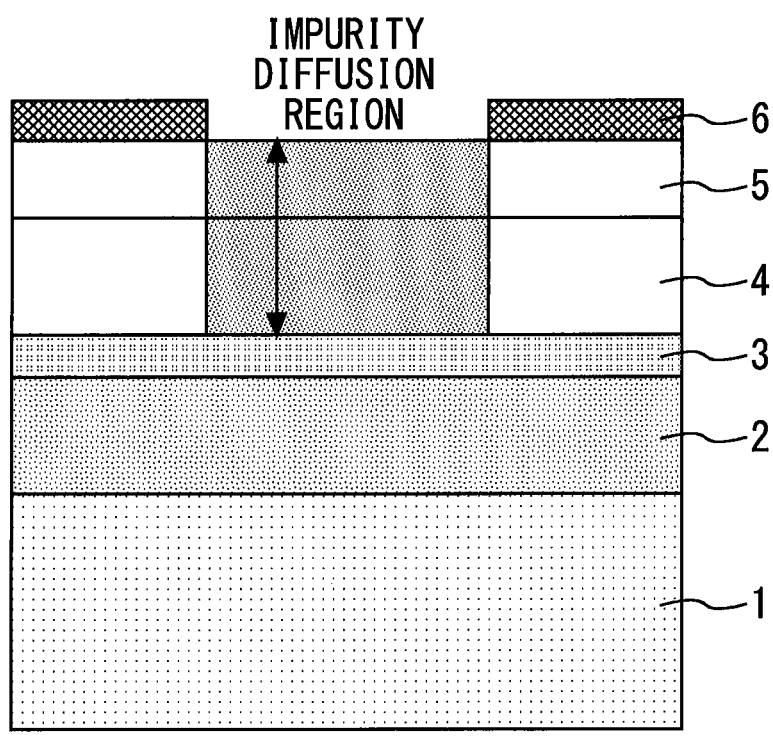
FIG. 6 is a cross-sectional view for illustrating a method for manufacturing a semiconductor device according to Embodiment 2 of the present invention.

FIG. 5 and FIG. 6 are cross-sectional views for illustrating a method for manufacturing a semiconductor device according to Embodiment 2 of the present invention. In Embodiment 1, formation of the cladding layer 4 and the contact layer 5 is followed by vapor phase diffusion still in the organometallic vapor-phase epitaxy device. On the contrary, in the present embodiment, after the cladding layer 4 and the contact layer 5 are formed, the n-type InP substrate 1 is taken out from the organometallic vapor-phase epitaxy device. Then, as shown in FIG. 5, a selection mask 6 of $SiO_2$ or the like for limiting the diffusion region is formed on the contact layer 5. Next, the n-type InP substrate 1 is introduced again into the organometallic vapor-phase epitaxy device, as shown in FIG. 6, to perform the vapor phase diffusion step described in Embodiment 1. Such formation of the selection mask 6 enables selective formation of the diffusion region of the impurity although this does not change the impurity diffusion profile along the thickness direction. For example, a current constriction structure for a semiconductor laser can be formed through vapor phase diffusion. Accordingly, a current can be efficiently injected into an active layer to enhance light emission efficiency.

Embodiment 3

Figure 7:
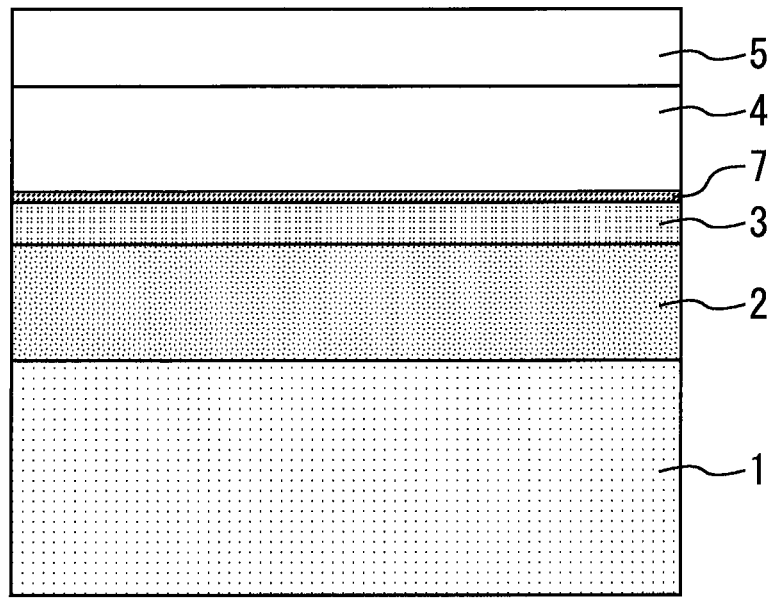
FIG. 7 is a cross-sectional view for illustrating a method for manufacturing a semiconductor device according to Embodiment 3 of the present invention.

FIG. 7 is a cross-sectional view for illustrating a method for manufacturing a semiconductor device according to Embodiment 3 of the present invention. A low diffusion layer 7 lower in diffusion speed of the impurity than the cladding layer 4 is formed between the active layer 3 and the cladding layer 4. The low diffusion layer 7 is, for example, a layer to which Mg, C or the like is added, which is low in diffusion factor, or a compressive strain layer (for example, see Patent Literature 3). In this way, an impurity can be further suppressed from diffusing into the active layer 3 during vapor phase diffusion.

Figure 8:
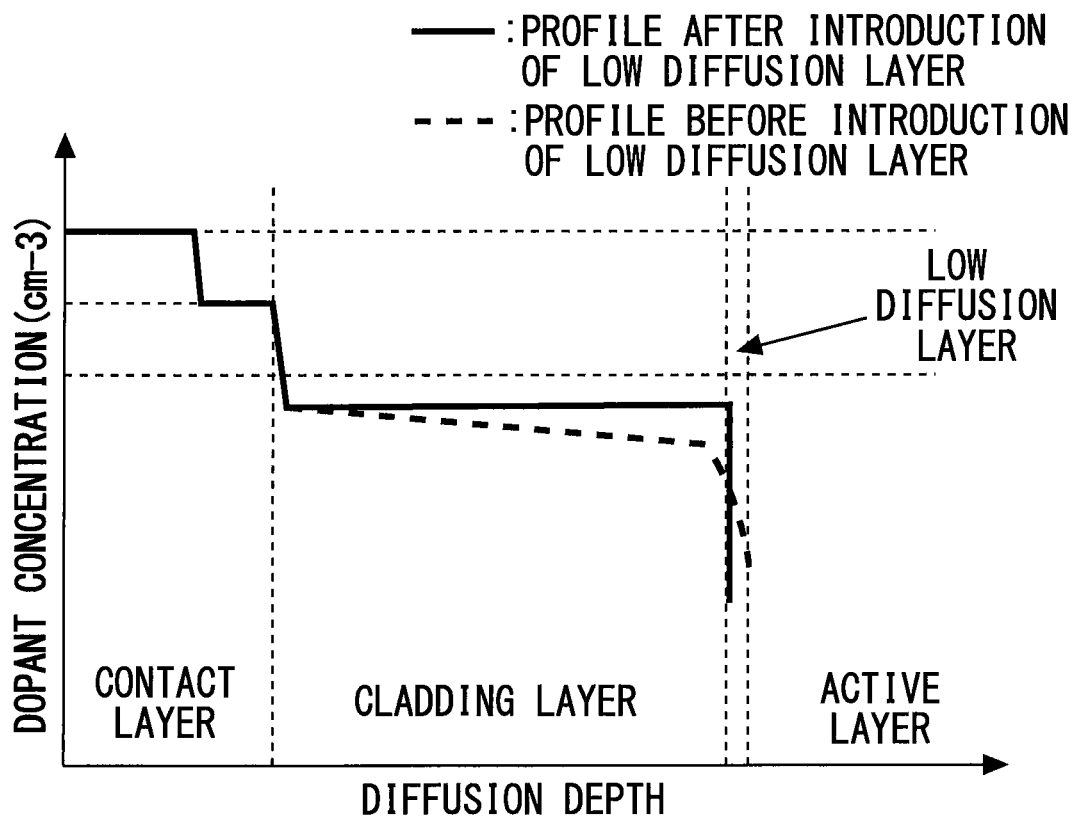
FIG. 8 is a diagram illustrating impurity profiles of a semiconductor device according to Embodiment 3 of the present invention.

FIG. 8 is a diagram illustrating impurity profiles of a semiconductor device according to Embodiment 3 of the present invention. Introduction of the low diffusion layer 7 can further make the impurity concentration profile in the cladding layer 4 flat.

Notably, while for Embodiments 1 to 3, production methods of lasers using compound semiconductor are described, the present invention does not restrict devices thereto but types and structure of devices can be properly varied.

REFERENCE SIGNS LIST 3 active layer (lower layer); 4 cladding layer (upper layer); 5 contact layer (upper layer); 6 selection mask; 7 low diffusion layer

The invention claimed is:

1. A method for manufacturing a semiconductor device comprising:

forming an upper layer made of non-doped III-V compound semiconductor on a lower layer made of non-doped III-V compound semiconductor;

feeding impurity source gas through vapor phase diffusion using an organometallic vapor-phase epitaxy device to add an impurity to the upper layer;

continuing the vapor phase diffusion with the feed of the impurity source gas stopped or with a feed amount of the impurity source gas lowered; and after stopping the feed of the impurity source gas or lowering the feed amount, continuing the vapor phase diffusion with the feed of the impurity source gas resumed or with the feed amount raised.

2. The method for manufacturing a semiconductor device according to claim 1, wherein the lower layer is an active layer, and the upper layer is a contact layer or a cladding layer.

3. The method for manufacturing a semiconductor device according to claim 2, further comprising forming a selection mask for limiting a diffusion region on the upper layer before the vapor phase diffusion.

4. The method for manufacturing a semiconductor device according to claim 2, further comprising forming a low diffusion layer lower in diffusion speed of the impurity than the upper layer between the lower layer and the upper layer.

5. The method for manufacturing a semiconductor device according to claim 1, further comprising forming a selection mask for limiting a diffusion region on the upper layer before the vapor phase diffusion.

6. The method for manufacturing a semiconductor device according to claim 5, further comprising forming a low diffusion layer lower in diffusion speed of the impurity than the upper layer between the lower layer and the upper layer.

7. The method for manufacturing a semiconductor device according to claim 1, further comprising forming a low diffusion layer lower in diffusion speed of the impurity than the upper layer between the lower layer and the upper layer.

* * * * *